(12) United States Patent
Kato

(10) Patent No.: US 11,557,821 B2
(45) Date of Patent: Jan. 17, 2023

(54) MILLIMETER WAVE MODULE INCLUDING FIRST AND SECOND CONDUCTOR PATTERNS CONNECTED BY FIRST AND SECOND CONDUCTIVE MEMBERS EXTENDING THROUGH AN INSULATING SUBSTRATE AND METHODS OF MANUFACTURE

(71) Applicant: Murata Manufacturing Co., Ltd., Kyoto (JP)

(72) Inventor: Takatoshi Kato, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 61 days.

(21) Appl. No.: 17/000,645

(22) Filed: Aug. 24, 2020

(65) Prior Publication Data

US 2020/0388897 A1 Dec. 10, 2020

Related U.S. Application Data

(63) Continuation of application No. PCT/JP2018/043654, filed on Nov. 28, 2018.

(30) Foreign Application Priority Data

Apr. 25, 2018 (JP) .............................. JP2018-083543

(51) Int. Cl.
*H01P 5/02* (2006.01)
*H01P 3/08* (2006.01)
(Continued)

(52) U.S. Cl.
CPC .............. *H01P 5/028* (2013.01); *H01P 3/006* (2013.01); *H01P 3/08* (2013.01); *H01P 3/088* (2013.01);
(Continued)

(58) Field of Classification Search
CPC .. H01P 5/02; H01P 5/028; H01P 3/006; H01P 3/082; H01P 3/088
(Continued)

(56) References Cited

U.S. PATENT DOCUMENTS

2004/0196122 A1* 10/2004 Fisher et al. ............ H01P 5/184
333/246
2006/0022312 A1 2/2006 Greeley
(Continued)

FOREIGN PATENT DOCUMENTS

JP H11150371 A 6/1999
JP 2000068713 A 3/2000
JP 2016100579 A 5/2016

OTHER PUBLICATIONS

International Search Report issued in Application No. PCT/JP2018/043654, dated Feb. 12, 2019.
(Continued)

*Primary Examiner* — Benny T Lee
(74) *Attorney, Agent, or Firm* — Pearne & Gordon LLP

(57) ABSTRACT

Signal conductor patterns (21, 31) are respectively formed on a first main surface (101) and a second main surface (102) of an insulating substrate (100). Ground conductor patterns (222, 322) are formed on the first main surface (101) and the second main surface (102). A first conductive member (41) is formed in the insulating substrate (100) and electrically connects the signal conductor patterns (21, 31) in the thickness direction. A second conductive member (42) is formed in the insulating substrate (100) and connected to the ground conductor patterns (222, 322). A dielectric member (43) is disposed between the first conductive member (41) and the second conductive member (42), is in contact with the first conductive member (41) and the second conductive member
(Continued)

(42), and has a dielectric constant different from the dielectric constant of the insulating substrate (100).

6 Claims, 11 Drawing Sheets

(51) Int. Cl.
H01P 11/00 (2006.01)
H01P 3/00 (2006.01)
H01Q 9/04 (2006.01)
(52) U.S. Cl.
CPC .............. *H01P 5/02* (2013.01); *H01P 11/003* (2013.01); *H01Q 9/0407* (2013.01)
(58) Field of Classification Search
USPC ........................................................ 333/246
See application file for complete search history.

(56) References Cited

U.S. PATENT DOCUMENTS

2006/0022774 A1* 2/2006 Greeley .................. H01P 1/047
333/246
2006/0044083 A1* 3/2006 Kuzmenka .............. H01P 1/047
333/246

OTHER PUBLICATIONS

Written Opinion issued in Application No. PCT/JP2018/043654, dated Feb. 12, 2019.
Chung-Hao Tsai, et al., Array Antenna Integrated Fan-out Wafer Level Packaging (InFO-WLP) for Millimeter Wave System Applications, IEDM 2013, pp. IEDM13-605 to IEDM13-608 (2013), Hsinchu County, Taiwan.

* cited by examiner ated Fan-out

MILLIMETER WAVE MODULE INCLUDING FIRST AND SECOND CONDUCTOR PATTERNS CONNECTED BY FIRST AND SECOND CONDUCTIVE MEMBERS EXTENDING THROUGH AN INSULATING SUBSTRATE AND METHODS OF MANUFACTURE

This is a continuation of International Application No. PCT/JP2018/043654 filed on Nov. 28, 2018 which claims priority from Japanese Patent Application No. 2018-083543 filed on Apr. 25, 2018. The contents of these applications are incorporated herein by reference in their entireties.

BACKGROUND OF THE DISCLOSURE

Field of the Disclosure

The present disclosure relates to a millimeter wave module that is an electronic component using a high frequency signal in a millimeter wave band.

Description of the Related Art

To date, various millimeter wave modules have been proposed. For example, NPL 1 describes a millimeter wave module using a component-embedded substrate technology.

The millimeter wave module described in NPL 1 uses a fan out wafer level package (FOWLP) technology.

NPL 1: C-H Tsai et al., "Array Antenna Integrated Fan-out Wafer Level Packaging (InFO-WLP) for Millimeter Wave System Applications, IEDM 2013, p. IEDM 13-605 (2013)

BRIEF SUMMARY OF THE DISCLOSURE

In existing millimeter wave modules, when forming a transmission line, an antenna, or the like in a plurality of layers that differ in the thickness direction, it is sometimes necessary to connect conductor patterns, which have been formed on the plurality of layers, via a conductor pattern or the like extending in the thickness direction.

However, the conductor pattern extending in the thickness direction has an inductance. The inductance causes mismatching in a millimeter wave frequency band, and transmission loss occurs between the conductor patterns on the plurality of layers.

Accordingly, an object of the present disclosure is to provide a millimeter wave module that suppresses the transmission loss between the conductor patterns on the plurality of layers.

A millimeter wave module according to the present disclosure includes an insulating substrate, a first conductor pattern, a second conductor pattern, a ground conductor pattern, a first conductive member, a second conductive member, and a dielectric member for generating capacitance. The insulating substrate has a first main surface and a second main surface that are disposed at different positions in a thickness direction and that are parallel to each other. The first conductor pattern is formed on the first main surface and transmits a millimeter wave signal. The second conductor pattern is formed on the second main surface and transmits the millimeter wave signal. The ground conductor pattern is formed on the first main surface or the second main surface. The first conductive member is formed in the insulating substrate between the first conductor pattern and the second conductor pattern and electrically connects the first conductor pattern to the second conductor pattern in the thickness direction. The second conductive member is formed in the insulating substrate at a position overlapping the ground conductor pattern and is connected to the ground conductor pattern. The dielectric member for generating capacitance is disposed between the first conductive member and the second conductive member, is in contact with the first conductive member and the second conductive member, and has a dielectric constant different from a dielectric constant of the insulating substrate.

With this configuration, due to a shape such that the first conductive member and the second conductive member are sandwiched by the dielectric member, a capacitor is formed between a connection line that connects the first conductor pattern to the second conductor pattern and the ground potential. Thus, even if the connection line has inductance, the characteristic impedance of a connection line has a desirable value, and impedance matching is realized. Moreover, with this configuration, the structure is simple and can be manufactured easily. Furthermore, the structure is simple and the shape can be realized with high precision.

In the millimeter wave module according to the present disclosure, preferably, the dielectric constant of the dielectric member is higher than the dielectric constant of the insulating substrate.

With this configuration, the size of a capacitor forming portion for obtaining a desirable capacitance is reduced.

In the millimeter wave module according to the present disclosure, preferably, the first conductive member, the second conductive member, and the dielectric member each have a columnar shape extending in the thickness direction.

With this configuration, the structure is simpler and can be manufactured more easily, and a shape having dimensions with high precision is more reliably realized.

In the millimeter wave module according to the present disclosure, preferably, the first conductive member and the second conductive member each have a shape having chamfered corners.

With this configuration, concentration of electric field at a corner between the first conductive member and the second conductive member is suppressed, and characteristics are further improved.

A method of manufacturing a millimeter wave module according to the present disclosure includes the following steps. The method includes a step of forming a dielectric member by forming a first hole in an insulating substrate having a first main surface and a second main surface that are disposed at different positions in a thickness direction and that are parallel to each other, the first hole extending from the first main surface to the second main surface, and by filling the first hole with a dielectric material having a dielectric constant different from a dielectric constant of the insulating substrate; and a step of forming a second conductive member by forming a second hole in the insulating substrate at a position that is in contact with the dielectric member, the second hole extending from the first main surface to the second main surface, and by filling the second hole with an electroconductive material. The method includes a step of forming a first conductive member by forming a third hole in the insulating substrate at a position that is in contact with the dielectric member and that is not in contact with the second conductive member, the third hole extending from the first main surface to the second main surface, and by filling the third hole with an electroconductive material. The method includes a step of forming, adjacent to the first main surface of the insulating substrate, a first conductor pattern at a position that overlaps the first conductive member, the first conductor pattern transmitting a millimeter wave signal, and forming a ground conductor pattern at a position that overlaps the second conductive member; and a step of forming, adjacent to the second main surface of the insulating substrate, a second conductor pattern at a position that overlaps the first conductive member, the second conductive pattern transmitting the millimeter wave signal, and forming a ground conductor pattern at a position that overlaps the second conductive member.

With this manufacturing method, a millimeter wave module having the desirable characteristic impedance described above can be manufactured easily and with high precision.

A method of manufacturing a millimeter wave module according to the present disclosure includes the following steps. The method includes a step of forming a fourth hole in an insulating substrate having a first main surface and a second main surface that are disposed at different positions in a thickness direction and that are parallel to each other, the fourth hole extending from the first main surface to the second main surface; and a step of forming a fifth hole in the insulating substrate at a position adjacent to the fourth hole, the fifth hole extending from the first main surface to the second main surface. The method includes a step of forming a first conductive member by filling the fourth hole of the insulating substrate with an electroconductive material; and a step of forming a second conductive member by filling the fifth hole of the insulating substrate with an electroconductive material. The method includes a step of forming a sixth hole in a region in the insulating substrate, the region being sandwiched between the first conductive member and the second conductive member, the sixth hole exposing side surfaces of the first conductive member and the second conductive member; and a step of forming a dielectric member by filling the sixth hole with a dielectric material having a dielectric constant different from a dielectric constant of the dielectric substrate. The method includes a step of forming, adjacent to the first main surface of the insulating substrate, a first conductor pattern at a position that overlaps the first conductive member, the first conductive pattern transmitting a millimeter wave signal, and forming a ground conductor pattern at a position that overlaps the second conductive member; and a step of forming, adjacent to the second main surface of the insulating substrate, a second conductor pattern at a position that overlaps the first conductive member, the second conductive pattern transmitting the millimeter wave signal, and forming a ground conductor pattern at a position that overlaps the second conductive member.

With this manufacturing method, a millimeter wave module having the desirable characteristic impedance described above can be manufactured easily and with high precision.

With the present disclosure, in a millimeter wave module, transmission loss between the conductor patterns on the plurality of layers can be suppressed.

DETAILED DESCRIPTION OF THE DISCLOSURE

Figure 1A:
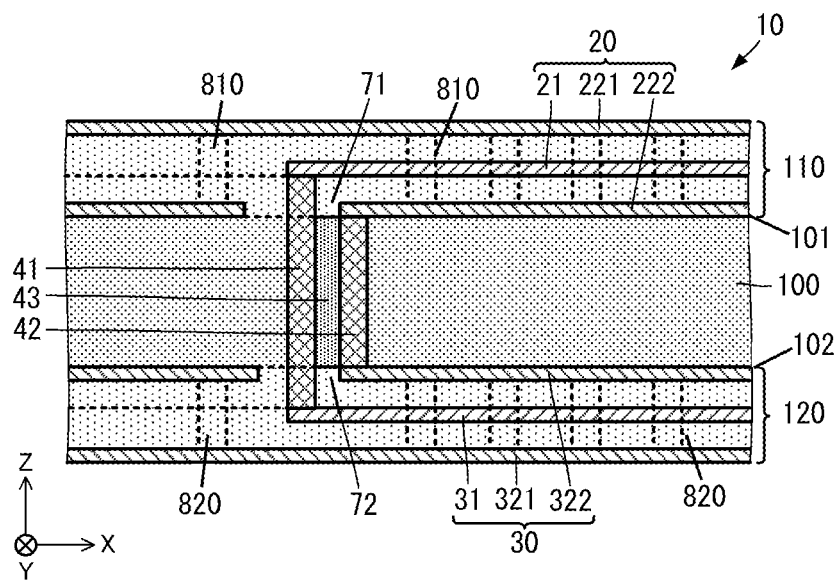
FIG. 1A is a side view of a millimeter wave module 10 according to a first embodiment.
Figure 1B:
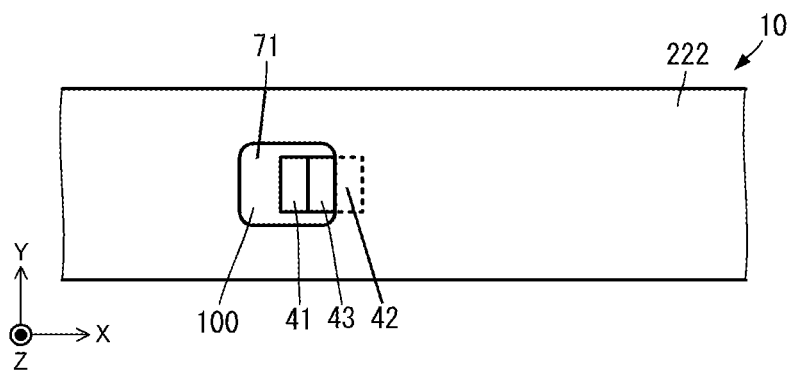
FIG. 1B is a plan view illustrating a layer of a ground conductor pattern 222 of the millimeter wave module 10 according to the first embodiment.
Figure 1C:
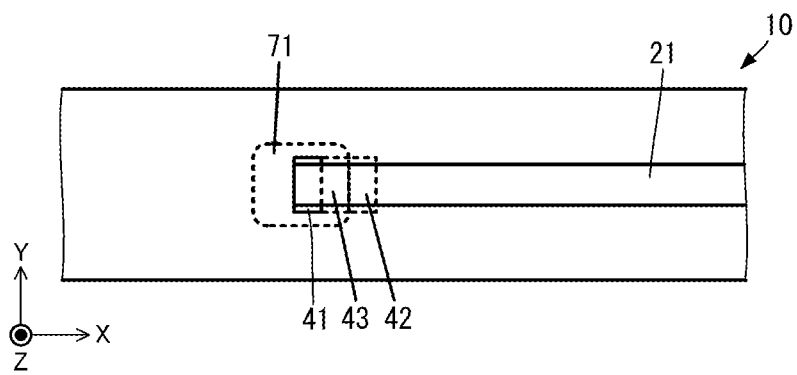
FIG. 1C is a plan view illustrating a layer of a signal conductor pattern 21 of the millimeter wave module 10 according to the first embodiment.

A millimeter wave module according to a first embodiment of the present disclosure will be described with reference to the drawings. FIG. 1A is a side view of a millimeter wave module 10 according to a first embodiment, FIG. 1B is a plan view illustrating a layer of a ground conductor pattern 222 of the millimeter wave module 10 according to the first embodiment, and FIG. 1C is a plan view illustrating a layer of a signal conductor pattern 21 of the millimeter wave module 10 according to the first embodiment. To facilitate understanding of configurations, the dimensions in the figures are exaggerated and differ from the actual dimensions.

As illustrated in FIGS. 1A, 1B, and 1C, the millimeter wave module 10 includes an insulating substrate 100, a rewiring layer 110, a rewiring layer 120, a first transmission line 20, a second transmission line 30, a first conductive member 41, a second conductive member 42, and a dielectric member 43.

The millimeter wave module 10 is realized by using, for example, a fan out wafer level package (FOWLP) technology.

The insulating substrate 100 has a first main surface 101 and a second main surface 102 that are parallel to each other. The first main surface 101 and the second main surface 102 extend in the X direction and the Y direction (the direction perpendicular to the X direction). The first main surface 101 and the second main surface 102 are separated from each other in the Z direction (the direction perpendicular to the X direction and the Y direction). The Z direction corresponds to the thickness direction of the insulating substrate 100.

The first transmission line 20 is formed in the rewiring layer 110 on the first main surface 101 side of the insulating substrate 100.

The first transmission line 20 includes the signal conductor pattern 21, a ground conductor pattern 221, and the ground conductor pattern 222. The signal conductor pattern 21 corresponds to "first conductor pattern" in the present disclosure.

The ground conductor pattern 222 is formed on the first main surface 101 of the insulating substrate 100. The ground conductor pattern 222 is a flat-film-shaped conductor pattern having a predetermined area. The ground conductor pattern 222 is formed, for example, on substantially the entirety of the first main surface 101 in a region of the insulating substrate 100 that is used as the millimeter wave module 10.

The ground conductor pattern 222 has a conductor-free portion 71 having a predetermined area.

The signal conductor pattern 21 is formed on a side opposite to the insulating substrate 100 side with respect to the ground conductor pattern 222. An insulator layer that forms the rewiring layer 110 is formed between the signal conductor pattern 21 and the ground conductor pattern 222. The insulating layer is also formed on substantially the entirety of the first main surface 101 side in a region of the insulating substrate 100 that is used as the millimeter wave module 10.

As illustrated in FIG. 1C, the signal conductor pattern 21 has a predetermined width (the length in the Y direction) and has a shape extending in the X direction. One end of the signal conductor pattern 21 in the direction in which the signal conductor pattern 21 extends overlaps the conductor-free portion 71 of the ground conductor pattern 222 in plan view of the millimeter wave module 10.

The ground conductor pattern 221 is formed on a side opposite to the ground conductor pattern 222 side with respect to the signal conductor pattern 21. The ground conductor pattern 221 is a flat-film-shaped conductor pattern having a predetermined area.

The ground conductor pattern 221 is formed, for example, on substantially the entirety of the first main surface 101 side in a region of the insulating substrate 100 that is used as the millimeter wave module 10. An insulator layer that forms the rewiring layer 110 is formed between the signal conductor pattern 21 and the ground conductor pattern 221. The insulating layer is also formed on substantially the entirety of the first main surface 101 side in a region of the insulating substrate 100 that is used as the millimeter wave module 10.

The ground conductor pattern 221 and the ground conductor pattern 222 are connected by a plurality of via conductors 810.

With this configuration, the first transmission line 20 forms a stripline.

The second transmission line 30 is formed in the rewiring layer 120 on the second main surface 102 side of the insulating substrate 100.

The second transmission line 30 includes a signal conductor pattern 31, a ground conductor pattern 321, and a ground conductor pattern 322. The signal conductor pattern 31 corresponds to "second conductor pattern" in the present disclosure.

The ground conductor pattern 322 is formed on the second main surface 102 of the insulating substrate 100. The ground conductor pattern 322 is a flat-film-shaped conductor pattern having a predetermined area. The ground conductor pattern 322 is formed, for example, on substantially the entirety of the second main surface 102 in a region of the insulating substrate 100 that is used as the millimeter wave module 10.

The ground conductor pattern 322 has a conductor-free portion 72 having a predetermined area. The conductor-free portion 72 of the ground conductor pattern 322 overlaps the conductor-free portion 71 of the ground conductor pattern 222 in plan view of the millimeter wave module 10.

The signal conductor pattern 31 is formed on a side opposite to the insulating substrate 100 side with respect to the ground conductor pattern 322. An insulator layer that forms the rewiring layer 120 is formed between the signal conductor pattern 31 and the ground conductor pattern 322. The insulating layer is also formed on substantially the entirety of the second main surface 102 side in a region of the insulating substrate 100 used as the millimeter wave module 10.

The signal conductor pattern 31 has a predetermined width (the length in the Y direction) and has a shape extending in the X direction, as with the signal conductor pattern 21. One end of the signal conductor pattern 31 in the direction in which the signal conductor pattern 31 extends overlaps the conductor-free portion 72 of the ground conductor pattern 322 in plan view of the millimeter wave module 10.

The ground conductor pattern 321 is formed on a side opposite to the ground conductor pattern 322 side with respect to the signal conductor pattern 31. The ground conductor pattern 321 is a flat-film-shaped conductor pattern having a predetermined area.

The ground conductor pattern 321 is formed, for example, on substantially the entirety of the second main surface 102 side in a region of the insulating substrate 100 that is used as the millimeter wave module 10. An insulator layer that forms the rewiring layer 110 is formed between the signal conductor pattern 31 and the ground conductor pattern 321. The insulating layer is also formed on substantially the entirety of the second main surface 102 side in a region of the insulating substrate 100 that is used as the millimeter wave module 10.

The ground conductor pattern 321 and the ground conductor pattern 322 are connected by a plurality of via conductors 820.

With this configuration, the second transmission line 30 forms a stripline.

The first conductive member 41 has a columnar shape extending in the thickness direction of the insulating substrate 100. To be more specific, in the present embodiment, the first conductive member 41 has a rectangular parallelepiped shape.

The first conductive member 41 is disposed at a position that overlaps the conductor-free portion 71 of the ground conductor pattern 222 and overlaps one end of the signal conductor pattern 21 in plan view of the millimeter wave module 10. The first conductive member 41 is disposed at a position that overlaps the conductor-free portion 72 of the ground conductor pattern 322 and overlaps one end of the signal conductor pattern 31 in plan view of the millimeter wave module 10.

The first conductive member 41 extends through the insulating substrate 100 from the first main surface 101 to the second main surface 102 and reaches the inside of the rewiring layer 110 and the inside of the rewiring layer 120. An end portion of the first conductive member 41 on the rewiring layer 110 side is connected to the signal conductor pattern 21, and an end portion of the second conductive member 42 on the rewiring layer 120 side is connected to the signal conductor pattern 31. Thus, the first conductive member 41 electrically connects the signal conductor pattern 21 to the signal conductor pattern 31.

The second conductive member 42 has a columnar shape extending in the thickness direction of the insulating substrate 100. To be more specific, in the present embodiment, the second conductive member 42 has a rectangular parallelepiped shape.

The second conductive member 42 is disposed at an outer edge portion of the conductor-free portion 71 of the ground conductor pattern 222 and overlaps the ground conductor pattern 222 in plan view of the millimeter wave module 10. The second conductive member 42 is disposed at an outer edge portion of the conductor-free portion 72 of the ground conductor pattern 322 and overlaps the ground conductor pattern 322 in plan view of the millimeter wave module 10.

The second conductive member 42 extends through the insulating substrate 100 from the first main surface 101 to the second main surface 102. Accordingly, the second conductive member 42 is connected to the ground conductor pattern 222, and is connected to the ground conductor pattern 322. Thus, the second conductive member 42 electrically connects the ground conductor pattern 222 to the ground conductor pattern 322.

The dielectric member 43 has a columnar shape extending in the thickness direction of the insulating substrate 100. To be more specific, in the present embodiment, the dielectric member 43 has a rectangular parallelepiped shape.

The dielectric member 43 has a first side surface and a second side surface that are parallel to the thickness direction of the insulating substrate 100 and that face each other. The first side surface is in contact with the first conductive member 41, and the second side surface is in contact with the second conductive member 42.

With this configuration, the dielectric member 43 is sandwiched between the first conductive member 41 and the second conductive member 42, and a capacitor having a predetermined capacitance is formed. Accordingly, the capacitor is connected between a connection line that connects the signal conductor pattern 21 to the signal conductor pattern 31 and the ground potential.

Thus, even if the connection line that connects the first transmission line 20 to the second transmission line 30, which are formed in different layers, has an inductance, due to the capacitance, the characteristic impedance of the connection line can be made to match the characteristic impedance of the first transmission line 20 and the second transmission line 30. In other words, appropriate impedance matching between the first transmission line 20 and the second transmission line 30 is realized. As a result, low-loss transmission of a millimeter wave signal is realized between the first transmission line 20 and the second transmission line 30.

Figure 2:
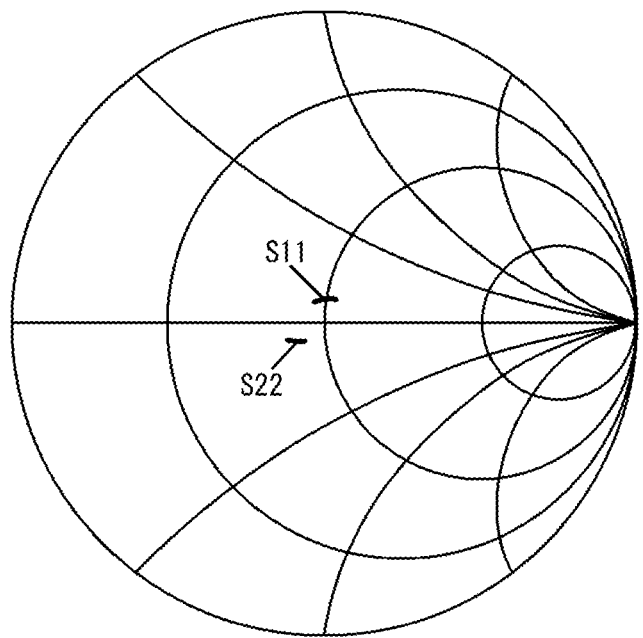
FIG. 2 is a Smith chart illustrating the reflection characteristics of the millimeter wave module 10 according to the first embodiment.

FIG. 2 is a Smith chart illustrating the reflection characteristics of the millimeter wave module according to the first embodiment. FIG. 2 illustrates S11 characteristics and S22 characteristics from 50 GHz to 70 GHz. As illustrated in FIG. 2, by using the configuration of the millimeter wave module 10, from 50 GHz to 70 GHz, S11 and S12 are near the center of the Smith chart. Accordingly, it can be seen that appropriate impedance matching is performed in a millimeter wave band.

Here, the dielectric constant of the dielectric member 43 differs from the dielectric constant of the insulating substrate 100. Thus, a desirable capacitance can be easily realized, and appropriate impedance matching can be further easily realized.

Preferably, the dielectric constant of the dielectric member 43 is higher than the dielectric constant of the insulating substrate 100. For example, when a material that is generally used as the material of a mold member used in a FOWLP technology is used as the material of the insulating substrate 100, the material of the dielectric member 43 may be alumina, having a dielectric constant of approximately 10; or aluminum nitride, zirconia, yttria, hafnia, or the like, having a dielectric constant of higher than 8. In this case, the size of a structure for forming capacitance can be reduced, and the size of the millimeter wave module 10 can be reduced.

Moreover, with this configuration, the first conductive member 41, the second conductive member 42, and the dielectric member 43, which constitute a connection line, each have a columnar shape, that is, a simple shape. Accordingly, by using a FOWLP technology or the like, the shapes of the first conductive member 41, the second conductive member 42, and the dielectric member 43 can be realized with high precision, and a desirable capacitance can be realized with high precision.

The millimeter wave module 10 having such a configuration can be manufactured, for example, by using a method described below.

Figure 3:
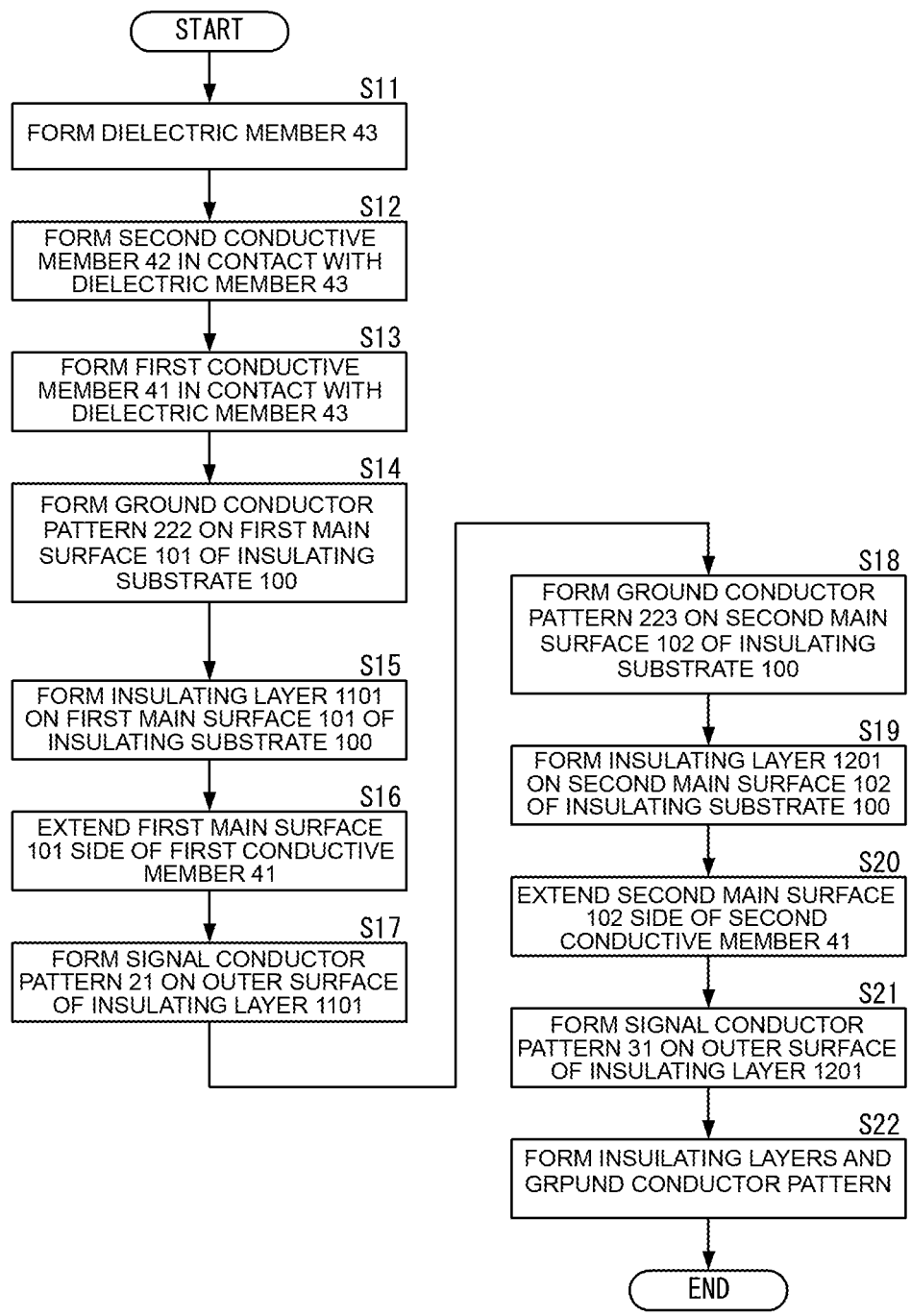
FIG. 3 is a flowchart of a first example of a method of manufacturing the millimeter wave module 10.

FIG. 3 is a flowchart of a first example of the method of manufacturing the millimeter wave module. FIGS. 4A to 4E and FIGS. 5A to 5D are sectional views illustrating shapes in main methods in the first example of the method of manufacturing a millimeter wave module.

Figure 4A:
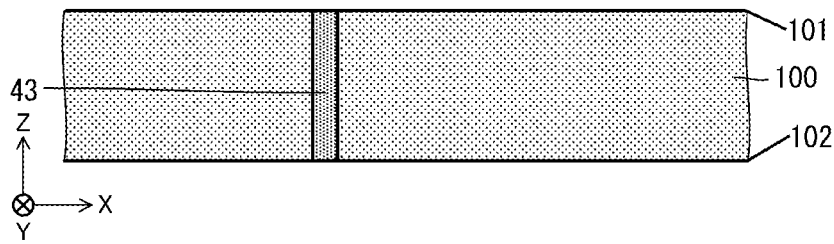
FIGS. 4A to 4E are sectional views illustrating shapes in main steps of the first example of the method of manufacturing the millimeter wave module 10.

First, a hole extending from the first main surface 101 to the second main surface 102 is formed in the insulating substrate 100. As illustrated in FIG. 4A, the dielectric member 43 is formed by filling the hole with a dielectric material having a dielectric constant different from that of the insulating substrate 100 (S11). The hole formed in this step corresponds to "the first hole" in the present disclosure.

Figure 4B:
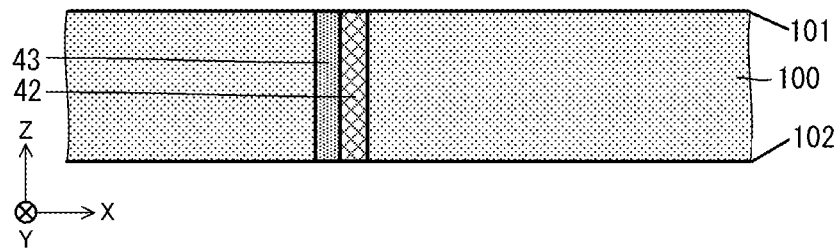
Figure 4C:
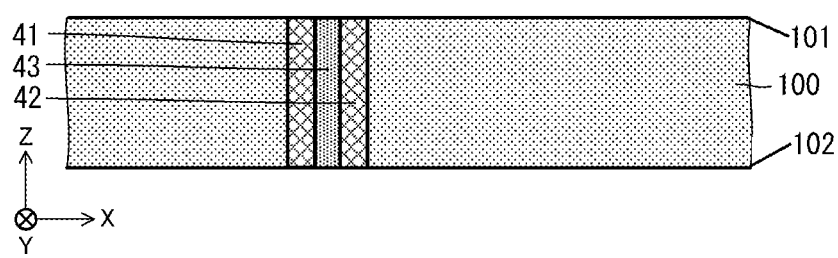

Next, a hole extending from the first main surface 101 to the second main surface 102 is formed at a position in the insulating substrate 100 that is in contact with the dielectric member 43. At this time, by forming the hole so as to partially include a region in which the dielectric member 43 is formed, the hole can be made to be in contact with the dielectric member 43. As illustrated in FIG. 4B, by filling the hole with an electroconductive material, the second conductive member 42 is formed (S12). The hole formed in this step corresponds to "the second hole" in the present disclosure.

Next, a hole extending from the first main surface 101 to the second main surface 102 is formed at a position in the insulating substrate 100 that is in contact with the dielectric member 43. At this time, by forming the hole so as to partially include a region in which the dielectric member 43 is formed, the hole and the dielectric member 43 can be made to be in contact with each other. As illustrated in FIG.

4C, by filling the hole with an electroconductive material, the first conductive member 41 is formed (S13). The hole formed in this step corresponds to "the third hole" in the present disclosure.

These steps can be realized by: forming recesses that extend from the first main surface 101 to the second main surface 102 successively in the insulating substrate 100; forming the dielectric member 43, the second conductive member 42, and the first conductive member 41 respectively in the recesses; and exposing the dielectric member 43, the second conductive member 42, and the first conductive member 41 by grinding a part of the insulating substrate 100 on the second main surface 102 side.

Figure 4D:
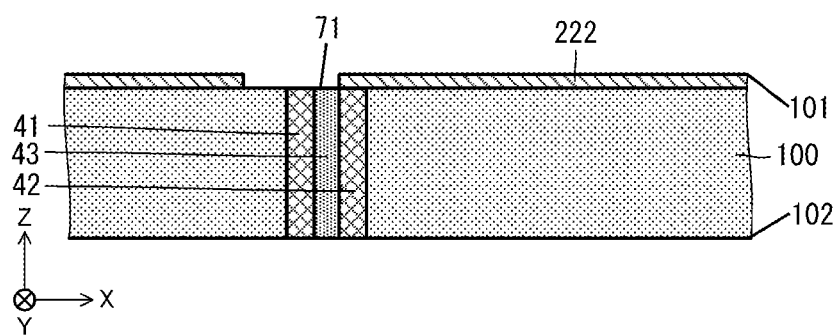
Figure 4E:
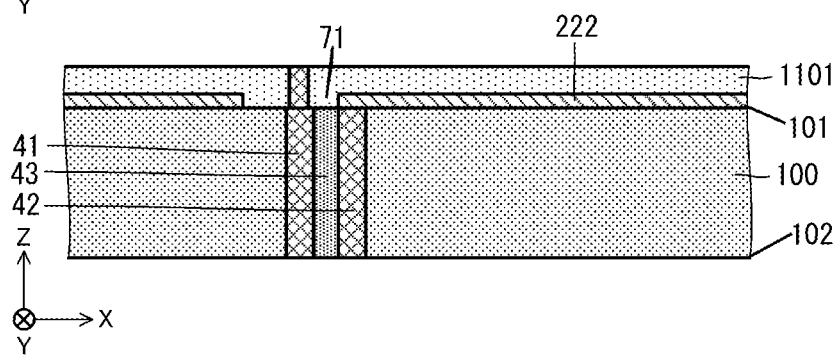

Next, as illustrated in FIG. 4D, the ground conductor pattern 222 is formed on the insulating substrate 100 side of the first main surface 101 (S14). At this time, the conductor-free portion 71 is formed in the ground conductor pattern 222 by patterning or the like. The conductor-free portion 71 has a shape that overlaps at least the first conductive member 41. Moreover, as illustrated in FIG. 4E, an insulating layer 1101 is formed on the insulating substrate 100 side of the first main surface 101 (S15). At this time, the insulating layer 1101 covers the entirety of the first main surface 101, including the ground conductor pattern 222.

Next, as illustrated in FIG. 4E, a hole is formed at a position in the insulating layer 1101 that overlaps the conductor-free portion 71, and the first conductive member 41 is extended by filling the hole with an electroconductive material (S16).

Figure 5A:
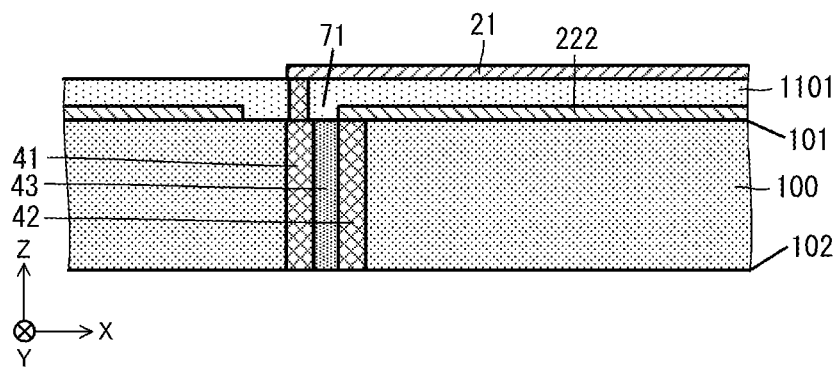
FIGS. 5A to 5D are sectional views illustrating shapes in main steps of the first example of the method of manufacturing the millimeter wave module 10.

Next, as illustrated in FIG. 5A, the signal conductor pattern 21 is formed on the surface layer of the insulating layer 1101 (S17). In this case, the signal conductor pattern 21 is formed so that one end of the signal conductor pattern 21 overlaps the first conductive member 41.

Figure 5B:
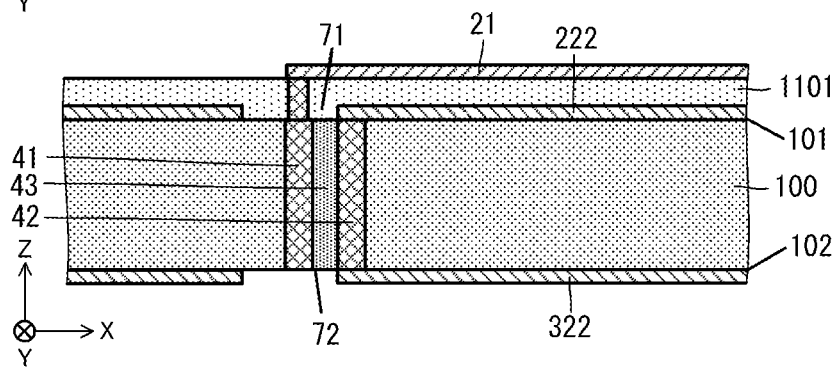
Figure 5C:
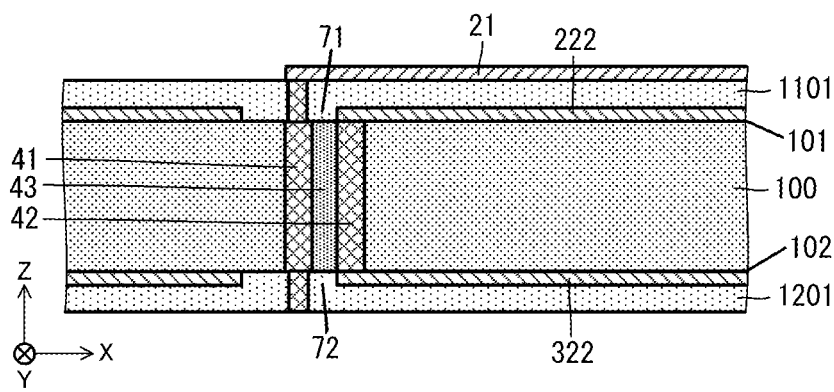

Next, as illustrated in FIG. 5B, the ground conductor pattern 322 is formed on the second main surface 102 side of the insulating substrate 100 (S18). At this time, the conductor-free portion 72 is formed in the ground conductor pattern 322 by patterning or the like. The conductor-free portion 72 has a shape that overlaps at least the first conductive member 41. Moreover, as illustrated in FIG. 5C, an insulating layer 1201 is formed on the second main surface 102 side of the insulating substrate 100 (S19). At this time, the insulating layer 1201 covers the entirety of the second main surface 102, including the ground conductor pattern 322.

Next, as illustrated in FIG. 5C, a hole is formed at a position in the insulating layer 1201 that overlaps the conductor-free portion 72, and the first conductive member 41 is extended by filling the hole with an electroconductive material (S20).

Figure 5D:
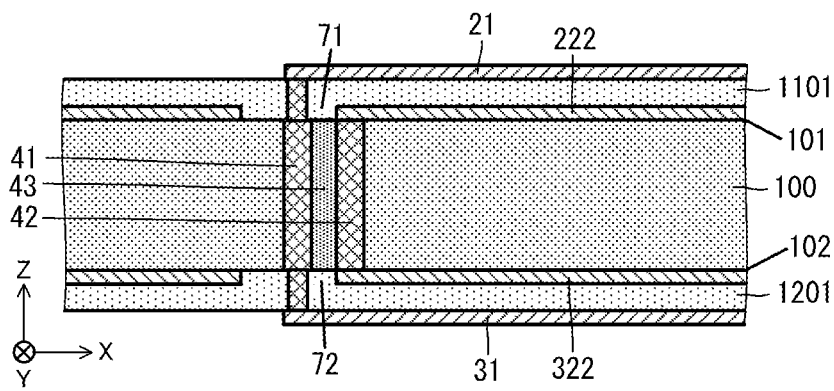

Next, as illustrated in FIG. 5D, the signal conductor pattern 31 is formed on the surface layer of the insulating layer 1201 (S21). At this time, the signal conductor pattern 31 is formed so that one end of the signal conductor pattern 31 overlaps the first conductive member 41.

Subsequently, although not illustrated in the figures, an insulating layer and the ground conductor pattern 222 are formed on the front surface of a structure shown in FIG. 5D, and an insulating layer and the ground conductor pattern 322 are formed on the back surface of the structure (S22). Thus, the first transmission line 20 and the second transmission line 30 are formed.

By using such a manufacturing method, the configuration of the millimeter wave module 10 described above can be realized reliably and with high precision.

Figure 6:
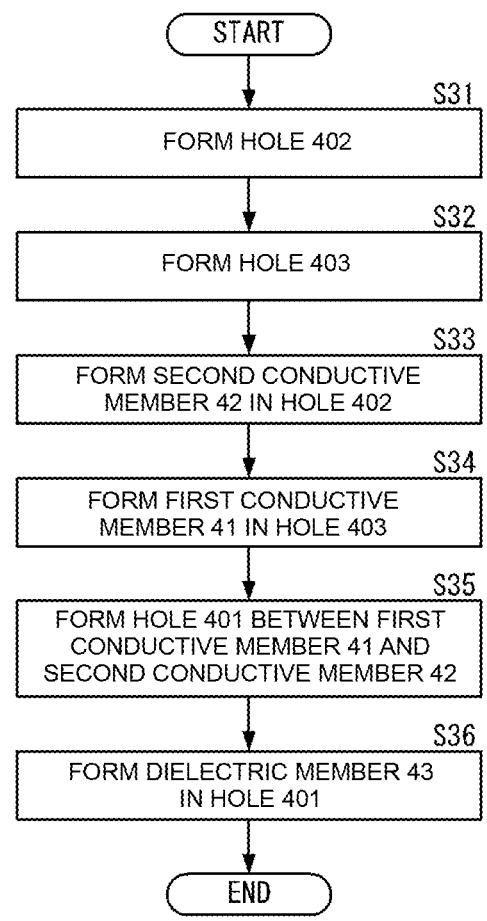
FIG. 6 is a flowchart of a second example of a method of manufacturing the millimeter wave module 10.

FIG. 6 is a flowchart of a second example of a method of manufacturing a millimeter wave module. FIGS. 7A to 7E are sectional views illustrating shapes in main steps of the second example of the method of manufacturing the millimeter wave module. The second example of the manufacturing method differs from the first example in steps performed until the first conductive member 41, the second conductive member 42, and the dielectric member 43 are formed. Subsequent steps in the second example are similar to those of the first example, and descriptions of the similar steps will be omitted.

Figure 7A:
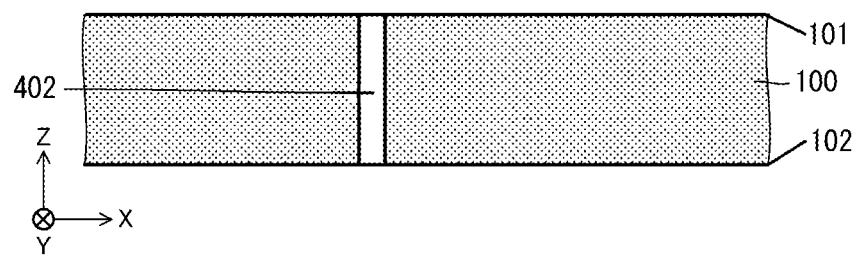
FIGS. 7A to 7E are sectional views illustrating shapes in main steps of the second example of the method of manufacturing the millimeter wave module 10.

First, as illustrated in FIG. 7A, a hole 402 extending from the first main surface 101 to the second main surface 102 is formed in the insulating substrate 100 (S31). The hole formed in this step corresponds to "the fifth hole" in the present disclosure.

Figure 7B:
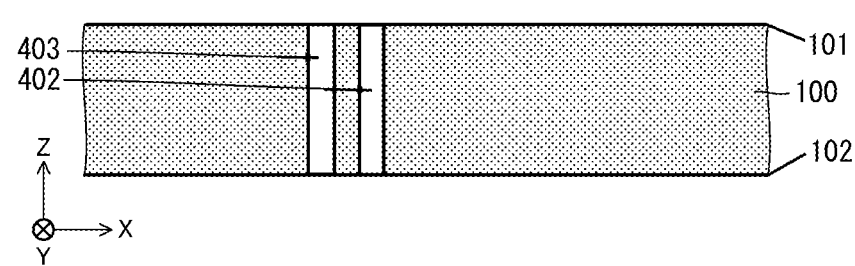
Figure 7C:
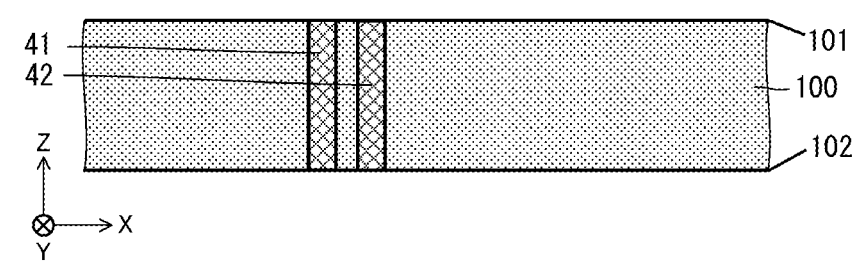
Figure 7D:
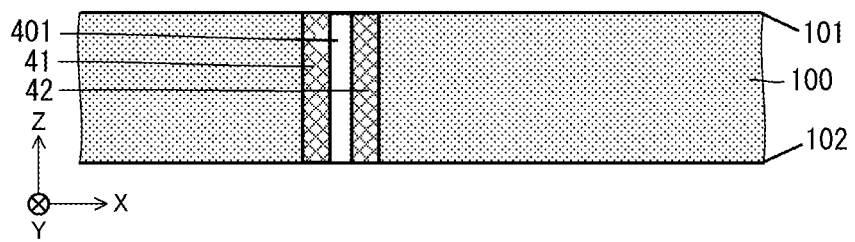
Figure 7E:
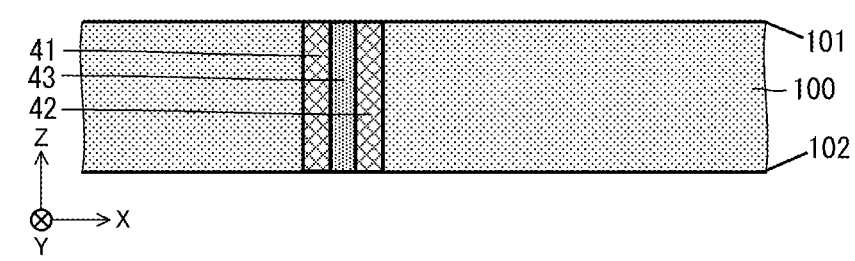

Next, as illustrated in FIG. 7B, a hole 403 is formed in the insulating substrate 100 at a position adjacent to the hole 402 (S32). The hole formed in this step corresponds to "the fourth hole" in the present disclosure. The order of forming the hole 402 and the hole 403 is not limited to this.

Next, the second conductive member 42 is formed by filling the hole 402 with an electroconductive material (S33). The first conductive member 41 is formed by filling the hole 403 with an electroconductive material (S34).

Next, a hole 401 is formed between the first conductive member 41 and the second conductive member 42 (S35). At this time, the hole 401 is formed so that a side surface of the first conductive member 41 and a side surface of the second conductive member 42 are each exposed with a predetermined area. The hole formed in this step corresponds to "the sixth hole" in the present disclosure.

The dielectric member 43 is formed by filling the hole 401 with a dielectric material having a dielectric constant different from that of the insulating substrate 100 (S36).

By using such a manufacturing method, the configuration of the millimeter wave module 10 described above can be realized reliably and with high precision.

Figure 8A:
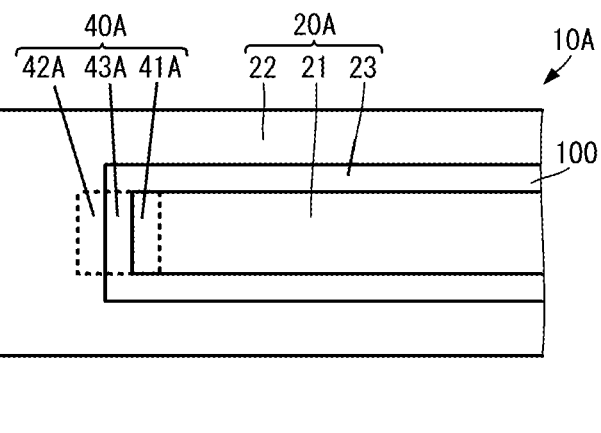
FIG. 8A illustrates a first main surface of a millimeter wave module 10A according to a second embodiment.
Figure 8B:
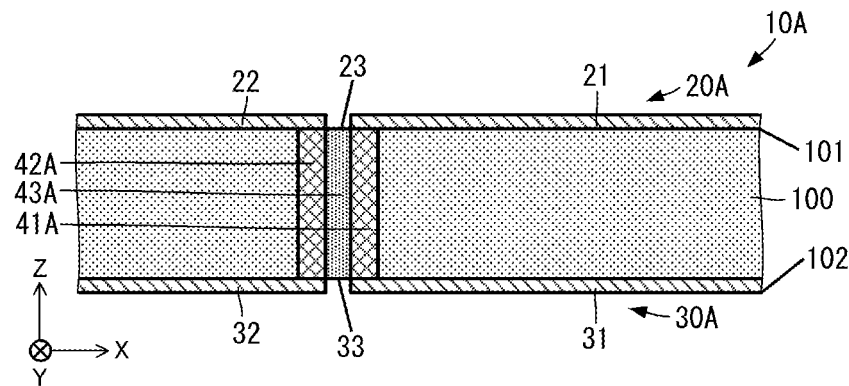
FIG. 8B is a sectional view of the millimeter wave module 10A according to the second embodiment.

Next, a millimeter wave module according to a second embodiment of the present disclosure will be described with reference to the drawings. FIG. 8A illustrates a first main surface 101 of a millimeter wave module 10A according to the second embodiment, and FIG. 8B is a sectional view of the millimeter wave module 10A according to the second embodiment. To facilitate understanding of configurations, the dimensions in the drawings are exaggerated and differ from the actual dimensions.

The millimeter wave module 10A according to the second embodiment differs from the millimeter wave module 10 according to the first embodiment in that the stripline is replaced with a coplanar waveguide (CPW). In other respects, the millimeter wave module 10A is similar to the millimeter wave module 10, and the description of similar parts will be omitted.

The millimeter wave module 10A includes an insulating substrate 100, a signal conductor pattern 21, a ground conductor pattern 22, a signal conductor pattern 31, a ground conductor pattern 32, a first conductive member 41A, a second conductive member 42A, and a dielectric member 43A.

The signal conductor pattern 21 and the ground conductor pattern 22 are formed on the first main surface 101 of the insulating substrate 100. The signal conductor pattern 21 and the ground conductor pattern 22 are separated by a gap 23 (conductor-free portion). Thus, a first transmission line 20A is formed.

The signal conductor pattern 31 and the ground conductor pattern 32 are formed on the second main surface 102 of the insulating substrate 100. The signal conductor pattern 31 and the ground conductor pattern 32 are separated by a gap 33 (conductor-free portion). Thus, a second transmission line 30A is formed.

The first conductive member 41A, the second conductive member 42A, and the dielectric member 43A each have a columnar shape. The basic materials and the methods of manufacturing the first conductive member 41A, the second conductive member 42A, and the dielectric member 43A are respectively similar to those of the first conductive member 41, the second conductive member 42, and the dielectric member 43.

The first conductive member 41A, the second conductive member 42A, and the dielectric member 43A are embedded in the insulating substrate 100 and exposed at the first main surface 101 and the second main surface 102. The dielectric member 43A is sandwiched between the first conductive member 41A and the second conductive member 42A.

The signal conductor pattern 21 is connected to an end portion of the first conductive member 41A on the first main surface 101 side. The signal conductor pattern 31 is connected to an end portion of the first conductive member 41A on the second main surface 102 side.

The ground conductor pattern 22 is connected to an end portion of the second conductive member 42A on the first main surface 101 side. The ground conductor pattern 32 is connected to an end portion of the second conductive member 42A on the second main surface 102 side.

With such a structure, the millimeter wave module 10A has operational advantages similar to those of the millimeter wave module 10.

Figure 9:
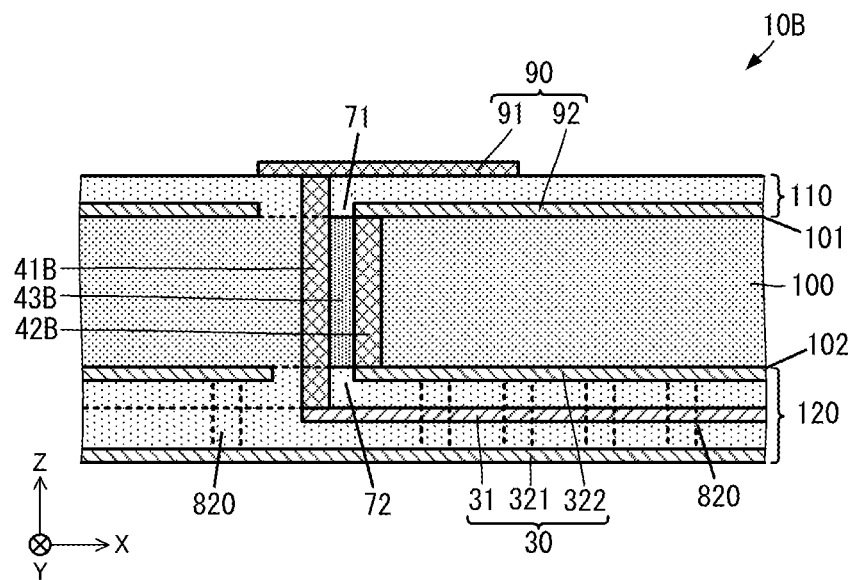
FIG. 9 is a sectional view illustrating the configuration of a millimeter wave module 10B according to a third embodiment.

Next, a millimeter wave module according to a third embodiment will be described with reference to the drawings. FIG. 9 is a sectional view illustrating the configuration of a millimeter wave module 10B according to the third embodiment. To facilitate understanding of configurations, the dimensions in the figure are exaggerated and differ from the actual dimensions.

The millimeter wave module 10B according to the third embodiment differs from the millimeter wave module 10 according to the first embodiment in that the first transmission line 20 is changed to an antenna 90. In other respects, the millimeter wave module 10B is similar to the millimeter wave module 10, and the description of similar parts will be omitted.

The antenna 90 is formed on the rewiring layer 110 on the first main surface 101 side of an insulating substrate 100. The antenna 90 includes a radiation conductor pattern 91 and a ground conductor pattern 92.

The radiation conductor pattern 91 is formed on the rewiring layer 110. The radiation conductor pattern 91 is a conductor pattern having a rectangular shape or the like, which forms a so-called "patch antenna".

The ground conductor pattern 92 is formed on the first main surface 101 of the insulating substrate 100 (the back surface of the rewiring layer 110). The ground conductor pattern 92 is formed so as to include a region that overlaps the radiation conductor pattern 91 in plan view and so as to have an area larger than the radiation conductor pattern 91.

The ground conductor pattern 92 includes the conductor-free portion 71 in a portion thereof that overlaps the radiation conductor pattern 91.

A first conductive member 41B is formed at a position that overlaps the conductor-free portion 71, and connects the radiation conductor pattern 91 to the signal conductor pattern 31. A connection point where the first conductive member 41B is connected to the radiation conductor pattern 91 is the feed point of the antenna 90.

A second conductive member 42B connects the ground conductor pattern 92 to the ground conductor pattern 322 of the second transmission line 30 formed on the second main surface 102.

With this configuration, the millimeter wave module 10B realizes a configuration that feeds electricity from the second transmission line 30 to the antenna 90. With this configuration, the millimeter wave module 10B can realize impedance matching between an electricity-feeding transmission line and an antenna with high precision. Accordingly, a millimeter wave antenna module with small loss can be realized.

In the above description, the first conductive member, the second conductive member, and the dielectric member are formed of conductor blocks. However, the first conductive member, the second conductive member, and the dielectric member may have the following configuration.

Figure 10A:
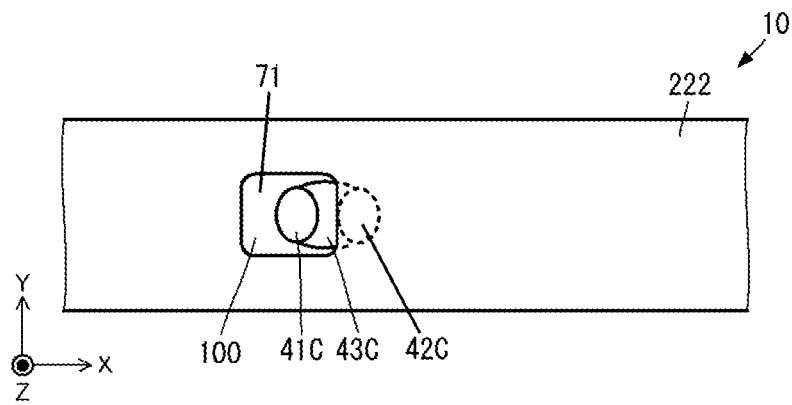
FIG. 10A is a plan view illustrating a layer of a ground conductor pattern 222 according to a first modification.
Figure 10B:
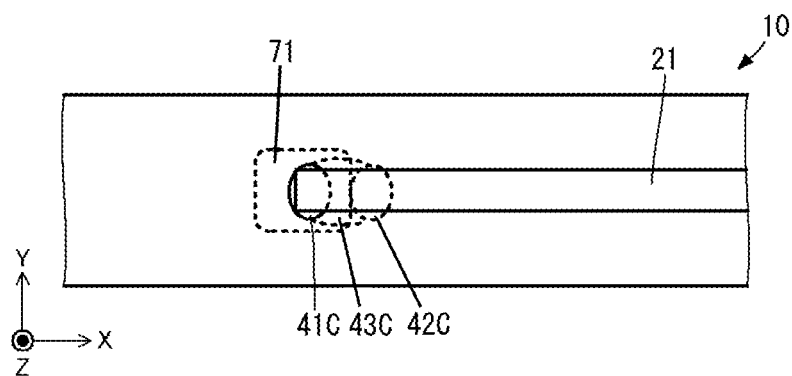
FIG. 10B is a plan view illustrating a layer of a signal conductor pattern 21 according to the first modification.

FIG. 10A is a plan view illustrating a layer of a ground conductor pattern 222 of a millimeter wave module 10 according to the first modification, and FIG. 10B is a plan view illustrating a layer of a signal conductor pattern 21 of the millimeter wave module 10 according to the first modification.

As illustrated in FIGS. 10A and 10B, a first conductive member 41C, a second conductive member 42C, and a dielectric member 43C each have a cylindrical shape that is elliptical in plan view.

Also, with such a configuration, operational advantages similar to those of the millimeter wave module described above can be obtained. Moreover, because the first conductive member 41C and the second conductive member 42C each have an elliptical cylindrical shape, the concentration of the electric field at a corner does not occur, and transmission loss can be further reduced.

As illustrated in FIGS. 10A and 10B, in plan view, the dielectric member 43C is larger than the first conductive member 41C and the second conductive member 42C. In other words, in a direction perpendicular to the direction in which the first conductive member 41C, the second conductive member 42C, and the dielectric member 43C are arranged and in a direction perpendicular to the direction in which the first conductive member 41C, the second conductive member 42C, and the dielectric member 43C extend (the Y direction in FIGS. 10A and 10B), the dimension of the dielectric member 43C is larger than the dimension of each of the first conductive member 41C and the second conductive member 42C. Accordingly, the electric field generated between the first conductive member 41C and the second conductive member 42C can be easily concentrated on the inside of the dielectric member 43C. Thus, a desirable capacitance can be easily realized, and transmission loss can be reduced.

Figure 11A:
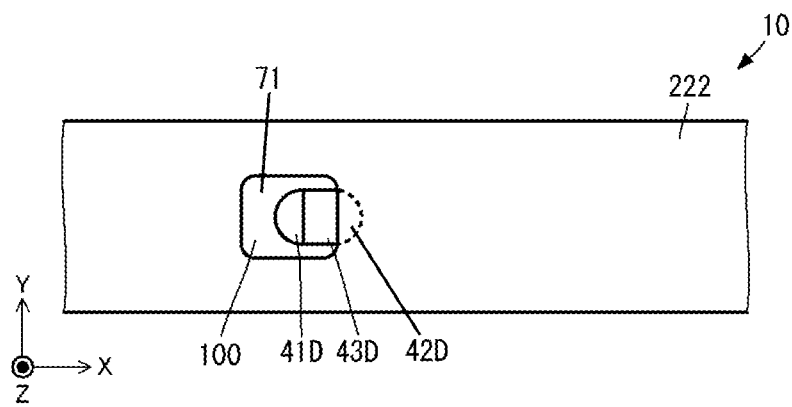
FIG. 11A is a plan view illustrating a layer of a ground conductor pattern 222 of a millimeter wave module 10 according to a second modification.
Figure 11B:
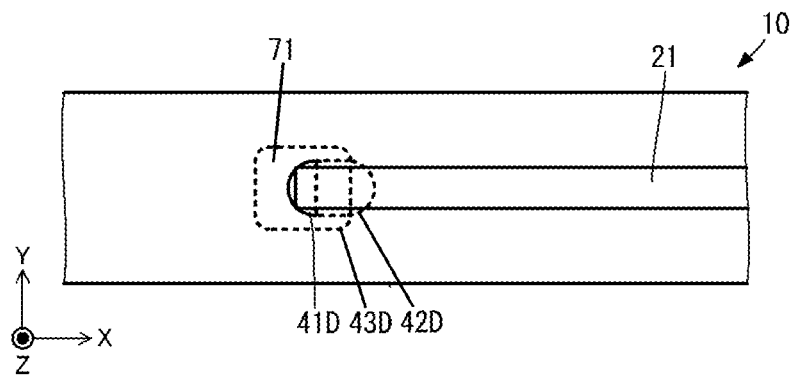
FIG. 11B is a plan view illustrating a layer of a signal conductor pattern 21 of the millimeter wave module 10 according to the second modification.

FIG. 11A is a plan view illustrating a layer of a ground conductor pattern 222 of a millimeter wave module 10 according to a second modification, and FIG. 11B is a plan view illustrating a layer of a signal conductor pattern 21 of the millimeter wave module 10 according to the second modification.

As illustrated in FIGS. 11A and 11B, a first conductive member 41D and a second conductive member 42D are each a cylinder having a semicircular shape in plan view.

A dielectric member 43D is rectangular-parallelepiped-shaped, and is in contact with a flat surface of the first conductive member 41D and a flat surface of the second conductive member 42D.

Also, with such a configuration, operational advantages similar to those of the millimeter wave module described above can be obtained. Moreover, because the corners of the first conductive member 41D and the second conductive member 42D are chamfered, the concentration of the electric field at a corner does not occur, and transmission loss can be further reduced.

In the configuration described above, the first conductive member and the second conductive member sandwich a single-layer dielectric member therebetween. However, the first conductive member and the second conductive member may sandwich a multi-layer dielectric member therebetween.

Figure 12A:
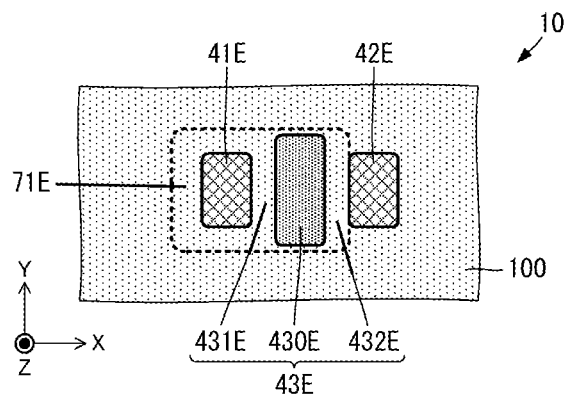
FIG. 12A is an enlarged plan view of a capacitor forming portion of a millimeter wave module 10 according to a third modification.
Figure 12B:
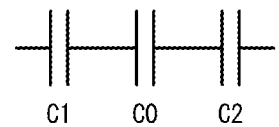
FIG. 12B is an equivalent circuit diagram of the capacitor forming portion.

FIG. 12A is an enlarged plan view of a capacitor forming portion of a millimeter wave module 10 according to a third modification, and FIG. 12B is an equivalent circuit diagram of the capacitor forming portion.

As illustrated in FIG. 12A, a dielectric member 430E is disposed between a first conductive member 41E and a second conductive member 42E. The dielectric member 430E is not in contact with the first conductive member 41E and the second conductive member 42E. In other words, the dielectric member 430E and the first conductive member 41E are separated, and the dielectric member 430E and the second conductive member 42E are separated. The dielectric constant of the dielectric member 430E differs from the dielectric constant of an insulating substrate 100. For example, the dielectric constant of the dielectric member 430E is lower than the dielectric constant of the insulating substrate 100.

A dielectric member 431E, which is a part of the insulating substrate 100, is disposed between the dielectric member 430E and the first conductive member 41E. The dielectric member 431E is in contact with the dielectric member 430E and the first conductive member 41E.

A dielectric member 432E, which is a part of the insulating substrate 100, is disposed between the dielectric member 430E and the second conductive member 42E. The dielectric member 432E is in contact with the dielectric member 430E and the second conductive member 42E.

In other words, in this configuration, a dielectric member 43E, which is formed by the dielectric member 431E, the dielectric member 430E, and the dielectric member 432E, is disposed between the first conductive member 41E and the second conductive member 42E.

With such a configuration, as illustrated in FIG. 12B, a capacitor formed by the dielectric member 430E (capacitance C0), a capacitor formed by the dielectric member 431E (capacitance C1), and a capacitor formed by the dielectric member 432E (capacitance C2) are connected in series between the first conductive member 41E and the second conductive member 42E. That is, equivalently, the dielectric member 43E having a composite capacitance of the capacitance C0, the capacitance C1, and the capacitance C2 is connected between the first conductive member 41E and the second conductive member 42E.

Also, with such a configuration, operational advantages similar to those of the millimeter wave module described above can be obtained. Moreover, with this configuration, in a case where the dielectric constant of the dielectric member 430E is lower than the dielectric constant of the insulating substrate 100, influence on capacitance due to manufacturing variation of the dielectric member 43E can be suppressed. That is, variation of capacitance between the first conductive member 41E and the second conductive member 42E due to manufacturing error can be suppressed. This configuration is effective in a case where the dielectric constant between the first conductive member 41E and the second conductive member 42E is lower than the dielectric constant of the insulating substrate 100.

Figure 13A:
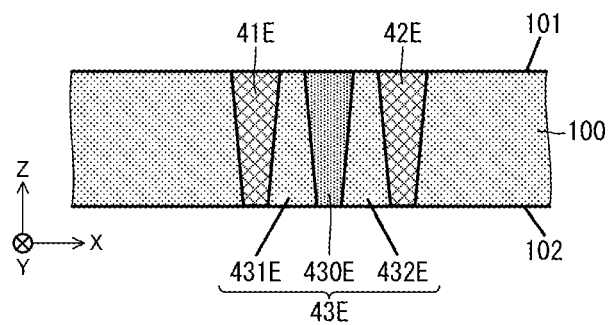
FIG. 13A is an enlarged side sectional view of the capacitor forming portion of the millimeter wave module 10 according to the third modification.
Figure 13B:
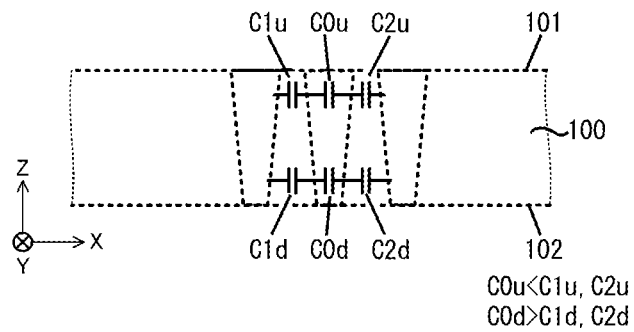
FIG. 13B illustrates the local configuration of capacitors in the capacitor forming portion.

Preferably, the configuration illustrated in FIG. 12A is applied to the configuration illustrated in FIG. 13A. FIG. 13A is an enlarged side sectional view of the capacitor forming portion of the millimeter wave module 10 according to the third modification, and FIG. 13B illustrates the local configuration of capacitors in the capacitor forming portion.

As illustrated in FIG. 13A, a first conductive member 41E, a second conductive member 42E, and a dielectric member 430E each have a shape such that the area on the first main surface 101 side is larger than the area on the second main surface 102 side. Accordingly, a dielectric member 431E and a dielectric member 432E each have a shape such that the area on the first main surface 101 side is smaller than the area on the second main surface 102 side. That is, the first conductive member 41E, the second conductive member 42E, the dielectric member 430E, the dielectric member 431E, and the dielectric member 432E each have a tapered shape in a side view.

With such a configuration, in the vicinity of the first main surface 101, the distance from the first conductive member 41E and the second conductive member 42E to the dielectric member 430E is relatively small, and, in the vicinity of the second main surface 102, the distance from the first conductive member 41E and the second conductive member 42E to the dielectric member 430E is relatively large.

Thus, in the vicinity of the first main surface 101, a capacitance $C1u$ due to the dielectric member 431E and a capacitance $C2u$ due to the dielectric member 432E are comparatively large, and a capacitance $C0u$ due to the dielectric member 430E is comparatively small. In the vicinity of the second main surface 102, a capacitance $C1d$ due to the dielectric member 431E and a capacitance $C2d$ due to the dielectric member 432E are comparatively small, and a capacitance $C0d$ due to the dielectric member 430E is comparatively large.

With this configuration, a capacitance generated in the vicinity of the first main surface 101 and a capacitance generated in the vicinity of the second main surface 102 cancel each other out with respect to positional displacement. Accordingly, the dependency of capacitance on position is reduced, the electric field concentration is reduced, and characteristics are improved.

In the above description, the width of each of the first conductive member, the second conductive member, and the dielectric member is substantially the same as the width of the signal conductor pattern. However, the width of each of the first conductive member, the second conductive member, and the dielectric member may considerably differ from the width of the signal conductor pattern. To be specific, the width of each of the first conductive member, the second conductive member, and the dielectric member may be larger than the width of the signal conductor pattern.

Figure 14A:
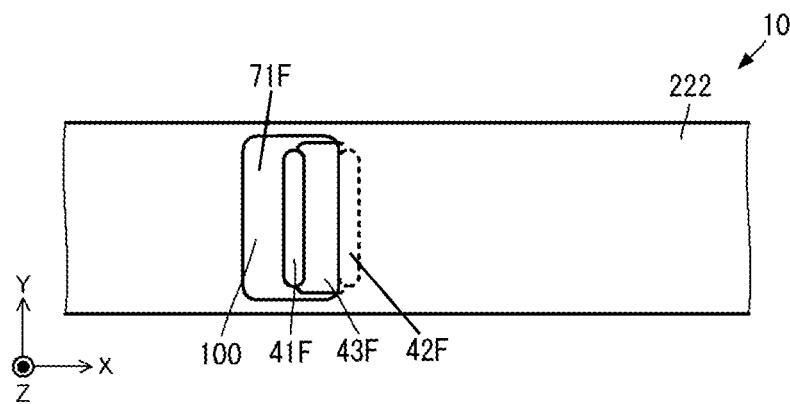
FIG. 14A is a plan view illustrating a layer of a ground conductor pattern 222 of a millimeter wave module 10 according to a fourth modification.
Figure 14B:
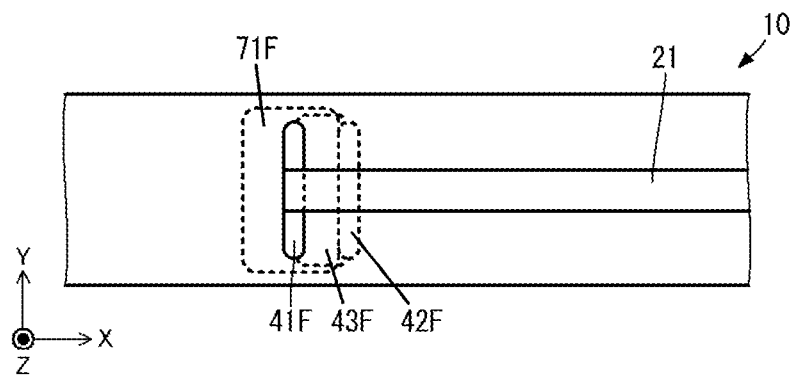
FIG. 14B is a plan view illustrating a layer of a signal conductor pattern 21 of the millimeter wave module 10 according to the fourth modification.

FIG. 14A is a plan view illustrating a layer of a ground conductor pattern 222 of a millimeter wave module 10 according to a fourth modification, and FIG. 14B is a plan view illustrating a layer of a signal conductor pattern 21 of the millimeter wave module 10 according to the fourth modification.

As illustrated in FIGS. 14A and 14B, the millimeter wave module 10 according to the fourth modification differs from the millimeter wave module 10 according to the second modification illustrated in FIGS. 11A and 11B in the shapes of a first conductive member 41F, a second conductive member 42F, a dielectric member 43F, and a conductor-free portion 71F. In other respects, the millimeter wave module 10 according to the fourth modification is similar to the millimeter wave module 10 according to the second modification, and the description of similar parts will be omitted.

The first conductive member 41F and the second conductive member 42F each have an oval shape in plan view (the shape of a cross section perpendicular to the thickness direction). The length of the long axis of the oval is the width of each of the first conductive member 41F and the second conductive member 42F in the present disclosure.

The width of each of the first conductive member 41F and the second conductive member 42F is considerably larger than the width of the signal conductor pattern 21. The width of the signal conductor pattern 21 is the length in which the signal conductor pattern 21 extends (the direction in which a high frequency signal is transmitted).

The dielectric member 43F has an oval shape or a rectangular shape with rounded corners in plan view (the shape of a cross section perpendicular to the thickness direction). The length of the long axis of the oval or the rectangle with rounded corners is the width of the dielectric member 43F in the present disclosure.

The width of the dielectric member 43F is considerably larger than the width of the signal conductor pattern 21.

The conductor-free portion 71F has a shape such that the first conductive member 41F is included inside thereof in plan view. Thus, the first conductive member 41F is not connected to the ground conductor pattern 222.

As in this configuration, by increasing the width of each of the first conductive member 41F, the second conductive member 42F, and the dielectric member 43F, the capacitance of the capacitor forming portion of the millimeter wave module can be increased. Thus, a large capacitance can be easily realized in the capacitor forming portion.

The width of each of the first conductive member 41F and the second conductive member 42F and the configuration of the dielectric member 43F shown in the fourth modification can be also applied to the third modification. In the third modification, the distance between the first conductive member and the second conductive member may be undesirably increased. However, as the width of each of the first conductive member and the second conductive member is increased, it is possible to suppress reduction of capacitance due to increase of the distance between the first conductive member and the second conductive member. Thus, a necessary capacitance in the capacitor forming portion of the millimeter wave module can be reliably obtained.

Configurations of the embodiments described above can be combined in any appropriate manner, and operational advantages in accordance with the combinations can be obtained.

10, 10A, 10B millimeter wave module
20, 20A first transmission line
21 signal conductor pattern
22 ground conductor pattern
30, 30A second transmission line
31 signal conductor pattern
32 ground conductor pattern
41, 41A, 41B, 41C, 41D, 41E, 41F first conductive member
42, 42A, 42B, 42C, 42D, 42E, 42F second conductive member
43, 43A, 43C, 43D, 43E, 430E, 431E, 432E, 43F dielectric member
71, 72, 71F conductor-free portion
90 antenna
91 radiation conductor pattern
92 ground conductor pattern
100 insulating substrate
101 first main surface
102 second main surface
110, 120, 1101, 1201 rewiring layer
221, 222, 321, 322 ground conductor pattern
401, 402, 403 hole
810, 820 via conductor

The invention claimed is:

1. A millimeter wave module comprising:
an insulating substrate having a first main surface and a second main surface, the first main surface and the second main surface being disposed at different positions in a thickness direction and being parallel to each other;
a first conductor pattern provided on the first main surface and transmitting a millimeter wave signal;
a second conductor pattern provided on the second main surface and transmitting the millimeter wave signal;
a ground conductor pattern provided on the first main surface or the second main surface;
a first conductive member provided in the insulating substrate between the first conductor pattern and the second conductor pattern and electrically connecting the first conductor pattern to the second conductor pattern in the thickness direction;
a second conductive member provided in the insulating substrate at a position overlapping the ground conductor pattern and connected to the ground conductor pattern; and
a dielectric member for generating capacitance, the dielectric member being disposed between the first conductive member and the second conductive member, being in contact with the first conductive member and the second conductive member, and having a dielectric constant different from a dielectric constant of the insulating substrate,
wherein the dielectric constant of the dielectric member is greater than the dielectric constant of the insulating substrate.

2. The millimeter wave module according to claim 1,
wherein the first conductive member and the second conductive member each have a shape having chamfered corners.

3. The millimeter wave module according to claim 1,
wherein the first conductive member, the second conductive member, and the dielectric member each have a columnar shape extending in the thickness direction.

4. The millimeter wave module according to claim 3,
wherein the first conductive member and the second conductive member each have a shape having chamfered corners.

5. A method of manufacturing a millimeter wave module, comprising:
a step of forming a dielectric member by forming a first hole in an insulating substrate having a first main surface and a second main surface, the first main surface and the second main surface being disposed at different positions in a thickness direction and being parallel to each other, the first hole extending from the first main surface to the second main surface, and by filling the first hole with a dielectric material having a dielectric constant different from a dielectric constant of the insulating substrate;

a step of forming a second conductive member by forming a second hole in the insulating substrate at a position being in contact with the dielectric member, the second hole extending from the first main surface to the second main surface, and by filling the second hole with a first electroconductive material;

a step of forming a first conductive member by forming a third hole in the insulating substrate at a position being in contact with the dielectric member and being not in contact with the second conductive member, the third hole extending from the first main surface to the second main surface, and by filling the third hole with a second electroconductive material;

a step of forming, adjacent to the first main surface of the insulating substrate, a first conductor pattern at a position overlapping with the first conductive member, the first conductive pattern transmitting a millimeter wave signal, and forming a first ground conductor pattern at a position that overlaps the second conductive member; and a step of forming, adjacent to the second main surface of the insulating substrate, a second conductor pattern at a position overlapping with the first conductive member, the second conductive pattern transmitting the millimeter wave signal, and forming a second ground conductor pattern at a position overlapping with the second conductive member, wherein the dielectric constant of the dielectric member is greater than the dielectric constant of the insulating substrate.

6. A method of manufacturing a millimeter wave module, comprising:

a step of forming a fourth hole in an insulating substrate having a first main surface and a second main surface, the first main surface and the second main surface being disposed at different positions in a thickness direction and being parallel to each other, the fourth hole extending from the first main surface to the second main surface;

a step of forming a fifth hole in the insulating substrate at a position adjacent to the fourth hole, the fifth hole extending from the first main surface to the second main surface;

a step of forming a first conductive member by filling the fourth hole of the insulating substrate with a first electroconductive material;

a step of forming a second conductive member by filling the fifth hole of the insulating substrate with a second electroconductive material;

a step of forming a sixth hole in a region in the insulating substrate, the region being sandwiched between the first conductive member and the second conductive member, the sixth hole exposing side surfaces of the first conductive member and the second conductive member;

a step of forming a dielectric member by filling the sixth hole with a dielectric material having a dielectric constant different from a dielectric constant of the insulating substrate;

a step of forming, adjacent to the first main surface of the insulating substrate, a first conductor pattern at a position overlapping with the first conductive member, the first conductive pattern transmitting a millimeter wave signal, and forming a first ground conductor pattern at a position overlapping with the second conductive member; and a step of forming, adjacent to the second main surface of the insulating substrate, a second conductor pattern at a position overlapping with the first conductive member, the second conductive pattern transmitting the millimeter wave signal, and forming a second ground conductor pattern at a position overlapping with the second conductive member, wherein the dielectric constant of the dielectric member is greater than the dielectric constant of the insulating substrate.

* * * * *